US011196353B2

(12) United States Patent
Keicher et al.

(10) Patent No.: US 11,196,353 B2
(45) Date of Patent: Dec. 7, 2021

(54) INTEGRATED POWER SYSTEM

(71) Applicant: Alion Science and Technology Corporation, McLean, VA (US)

(72) Inventors: Craig A. Keicher, Chittenango, NY (US); Michael J. Harlow, Parish, NY (US); Benjamin Craig, Ada, MI (US)

(73) Assignee: Alion Science and Technology Corporation, McLean, VA (US)

( * ) Notice: Subject to any disclaimer, the term of this patent is extended or adjusted under 35 U.S.C. 154(b) by 0 days.

(21) Appl. No.: 17/175,163

(22) Filed: Feb. 12, 2021

(65) Prior Publication Data

US 2021/0184591 A1     Jun. 17, 2021

Related U.S. Application Data

(63) Continuation-in-part of application No. 16/150,868, filed on Oct. 3, 2018, now Pat. No. 10,958,070.

(51) Int. Cl.
| | |
|---|---|
| *H05K 5/02* | (2006.01) |
| *H02M 7/00* | (2006.01) |
| *H02M 7/217* | (2006.01) |

(52) U.S. Cl.
CPC .......... *H02M 7/003* (2013.01); *H02M 7/217* (2013.01); *H05K 5/0217* (2013.01)

(58) Field of Classification Search
CPC ......................................... H05K 5/0217–0243
See application file for complete search history.

(56) References Cited

U.S. PATENT DOCUMENTS

| 8,848,409 B2 | 9/2014 | Dujic et al. |
| 2009/0288324 A1 | 11/2009 | Peterson et al. |
| 2014/0361671 A1 | 12/2014 | Degner et al. |
| 2016/0165716 A1 | 6/2016 | Ido et al. |

OTHER PUBLICATIONS

PCT/US18/54173 ISA Search Report dated Nov. 1, 2019.

*Primary Examiner* — Jeremy C Norris
(74) *Attorney, Agent, or Firm* — Hunton Andrews Kurth LLP

(57) ABSTRACT

A power system is disclosed that includes a chassis configured to house one or more boards in which the boards are electrically coupled to one another. The boards are configured to receive external power and to output power using a plurality of different voltages. The boards are configured to receive power from at least one internal power source electrically coupled boards and to output power using a plurality of different voltages. The boards include one or more converters configured to convert power. The one or more converters are thermally interfaced with one or more portions of the chassis.

30 Claims, 6 Drawing Sheets

INTEGRATED POWER SYSTEM

CROSS REFERENCE TO RELATED U.S. PATENT APPLICATIONS

This application is a continuation in part of U.S. patent application Ser. No. 16/150,868, titled Integrated Power System, and having a filing date of Oct. 3, 2018, which is incorporated herein by reference in its entirety.

BACKGROUND

A guidance system and targeting system for a tube-launched, optically-tracked, wire-guided or wireless (TOW) missile system requires a power system to operate. The power system typically includes several components, such as two battery assemblies, a battery charger, a battery charger monitor unit, a battery power conditioner, a vehicle power conditioner, at least two primary batteries, a battery case, and a TVPC, which may weigh over 170 pounds in total. Moreover, the conventional battery assembly utilizes nickel cadmium cell technology.

However, the list of problems with this legacy battery system are ever increasing. For example, the system itself is heavy and cumbersome to transport in the field, and when the system is deployed, the nickel cadmium batteries have, in practice, failed to provide the expected number of TOW missile firings. Additionally, charging and discharging the batteries is inefficient as the batteries must be recharged using a nonmobile AC charging unit. If targeting system operation is required, the legacy battery system cannot support the targeting system, and thus, an additional battery device is required to operate the targeting system. Furthermore, the supply of nickel cadmium is diminishing, and one or more component(s) of the conventional battery system may be obsolete or become obsolete. Therefore, the cost of replacing one or more of these component(s) is ever increasing and may be difficult to source.

There is a need to provide an improved battery system to efficiently and cost effectively provide the required electrical power for various guidance systems and targeting systems.

SUMMARY

The present disclosure relates generally to power systems, and more particularly, to integrated power systems using improved battery technology and having a higher energy capacity than legacy battery systems. Additionally, various embodiments may include electromagnetic shielding to protect crucial internal electrical components from internal and external interference to provide high reliability in the design and electrical operating characteristics.

In one or more embodiments, the disclosed technology relates to a power system. The power system may include a chassis that is configured to house one or more rectifiers and one or more converters, for example. The chassis may also house one or more boards that are electrically coupled to the one or more rectifiers or one or more converters, for example. In various embodiments, the one or more boards are configured to receive power and to simultaneously output power at one or more voltages, for example. The one or more boards may be configured to receive power from at least one internal battery or other power source electrically coupled to a respective board of the one or more boards and to simultaneously output power comprising a plurality of voltages, for example. In various embodiments, the one or more rectifiers and the one or more converters may be configured to transform and convert the received power into a respective output power, for example. In various embodiments, the one or more rectifiers and one or more converters are thermally interfaced with one or more heatsink portions of the chassis, for example.

In one or more embodiments, the disclosed technology relates to a power system. The power system may include a chassis that is configured to house one or more rectifiers and one or more converters, for example. The chassis may also house one or more boards that are electrically coupled to the one or more rectifiers or one or more, for example. In various embodiments, the one or more boards are configured to receive power and to simultaneously output power at one or more voltages, for example. The one or more boards may be configured to receive power from at least one internal battery or other power source electrically coupled to a respective board of the one or more boards and to selectively output power comprising at least five voltages, for example. In various embodiments, the one or more rectifiers and one or more converters may be configured to transform and convert the received power into a respective output power, for example. In various embodiments, the one or more rectifiers and one or more converters are thermally interfaced with one or more portions of the chassis, for example.

A variety of additional aspects will be set forth in the description that follows. The aspects can relate to individual features and to combinations of features. It is to be understood that both the foregoing general description and the following detailed description are exemplary and explanatory only and are not restrictive of the broad inventive concepts upon which the embodiments disclosed herein are based.

BRIEF DESCRIPTION OF THE FIGURES

The following drawings are illustrative of particular embodiments of the present disclosure and therefore do not limit the scope of the present disclosure. The drawings are not to scale and are intended for use in conjunction with the explanations in the following detailed description.

DETAILED DESCRIPTION

Figure 1A:
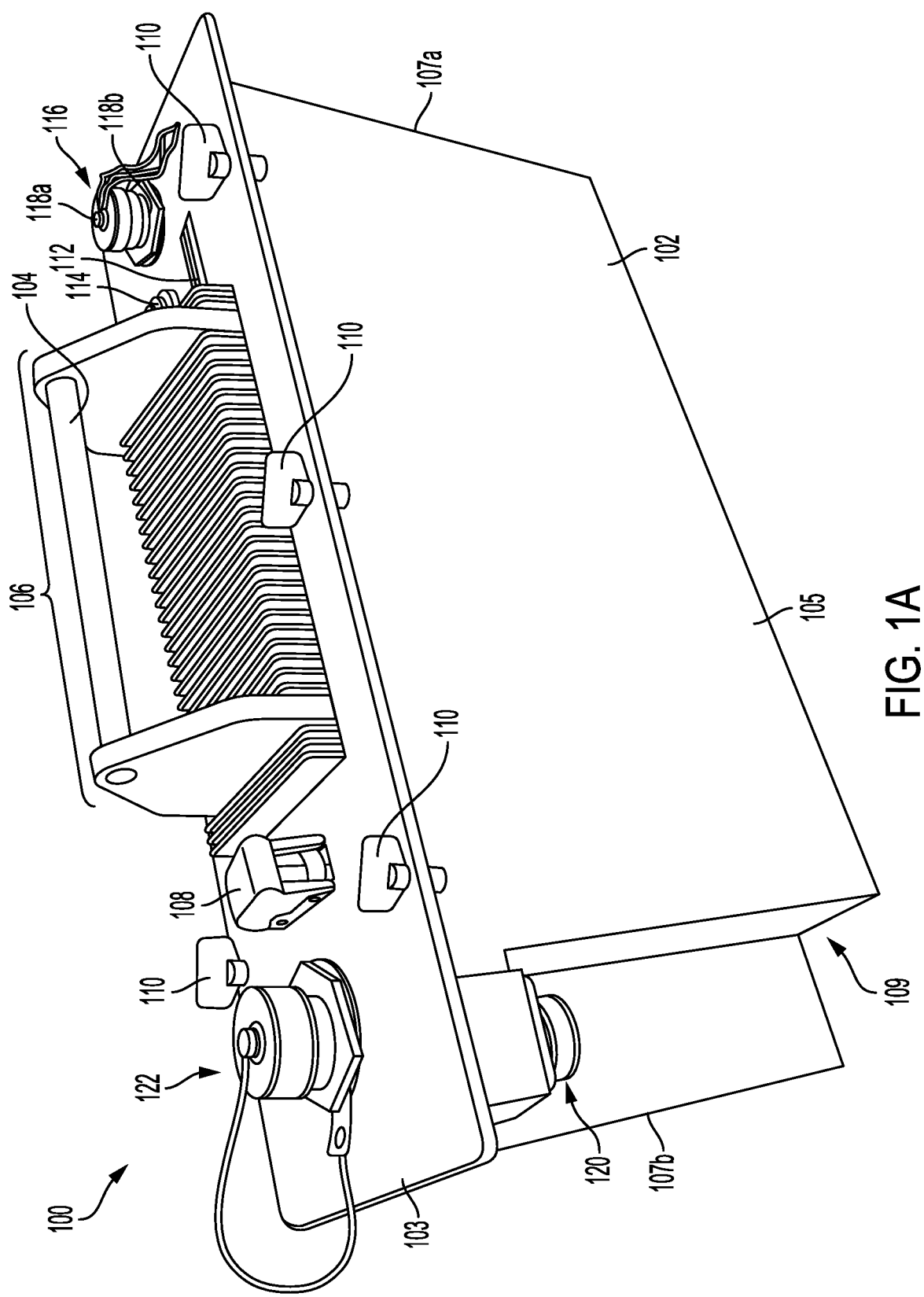
FIG. 1A illustrates a perspective view of an example integrated power system.

The following discussion omits or only briefly describes conventional features of power systems which are apparent to those skilled in the art. It is noted that various embodiments are described in detail with reference to the drawings, in which like reference numerals represent like parts and assemblies throughout the several views. Reference to various embodiments does not limit the scope of the claims attached hereto. Additionally, any examples set forth in this specification are intended to be non-limiting and merely set forth some of the many possible embodiments for the appended claims. Further, particular features described herein can be used in combination with other described features in each of the various possible combinations and permutations.

Unless otherwise specifically defined herein, all terms are to be given their broadest possible interpretation including meanings implied from the specification as well as meanings understood by those skilled in the art and/or as defined in dictionaries, treatises, etc. It must also be noted that, as used in the specification and the appended claims, the singular forms "a," "an" and "the" include plural referents unless otherwise specified, and that the terms "comprises" and/or "comprising," when used in this specification, specify the presence of stated features, elements, and/or components, but do not preclude the presence or addition of one or more other features, steps, operations, elements, components, and/or groups thereof.

Embodiments of the present disclosure relate generally to power systems, and more particularly, to an integrated power system using improved battery technology and having a higher energy capacity than conventional legacy power systems. Embodiments of the power systems are described below with reference to FIGS. 1A-4.

FIG. 1 illustrates a perspective view of an example integrated power system 100, according to one or more embodiments of the present disclosure.

The integrated power system 100 (hereinafter "system 100") includes a chassis 102 that houses the components of the system 100. The chassis 102 may include a handle 104 connected to a wall, such as the upper wall 103, of the chassis 102. In one or more embodiments, the handle 104 is fixed to the chassis 102. In one or more other embodiments, the handle 104 is fastened to a portion of the upper wall 103 and is rotatable on the chassis 102, such that the handle 104 can move to an up position being perpendicular to the horizontal surface of the upper wall 103 of the chassis 102, or can move to a down position being parallel to the horizontal surface of the upper wall 103 of the chassis 102. In some embodiments, the chassis 102 is made of a metal, such as aluminum. In some embodiments, the chassis 102 is made of a cast alloy, for example cast aluminum A356. The walls of the chassis 102 are configured to thermally conduct and convect heat from the internal components of the chassis 102 to the outside environment. Additionally, in some embodiments, chassis 102 may include a desiccator valve 140. For example, a breathing desiccator valve comprising a two way pressure relief valve that may include a receptacle for insertion of a moisture drying desiccant cartridge or the like. In some embodiments, the system 100 is configured to receive a maximum input at or about 300 W of DC power, and is configured to generate a maximum output at or about 250 W. In some embodiments, the system 100 is configured to produce, at an average efficiency of 88%, which can generate up to or approximately 60 W of heat.

In one or more embodiments, the chassis 102 is configured to receive one or more fasteners 110 on the upper wall 103 of the chassis 102. The one or more fasteners 110 may be positioned to align with fastener receiving portions on a guidance system 224 battery receptacle, such as a Missile Guidance System ("MGS") battery receptacle of the MGS, for example. When a user inserts the integrated system 100 into the guidance system 224 battery receptacle, the fastener receiving portions may be inserted over the respective one or more fasteners 110. Thereafter, the user may tighten the one or more fasteners 110 to the guidance system 224, thereby securing the system 100 to a MGS, for example. In one or more embodiments, the one or more fasteners 110 can be turnlock fasteners, winged fasteners, screws, and/or any other type of fastener known to one of ordinary skill in the art. In some embodiments, the turnlock fasteners can be military turnlock fasteners NSN 5325-01-148-8601 or similar.

In one or more embodiments, the system 100 includes an input 122 and at least one of a first interface 120 and a second interface 116. In some embodiments, the input 122 and the second interface 116 are provide on the upper wall 103 of the chassis 102. In some embodiments, the first interface 120 is provided facing away from at least one of the input 122 and the second interface 116. In some embodiments, the rear wall 105 and either the side wall 107a or the side wall 107b form a notched wall portion 109. The notched wall portion 109 may surround at least two sides of the first interface 120, in which the first interface 120 is positioned on one wall of the notched wall portion 109, for example.

In some embodiments, each of the input 122, the first interface 120, and the second interface 116 includes a cap 118a and a terminal 118b. For example, the cap of the input 122 may be a receptacle cap, e.g., part. no. D38999/33W15N and the corresponding terminal of the input may be, e.g., part no. D38999/24WD97PN. In another example, the cap 118a for each of the first interface 120 and the second interface 116 may be cap, e.g., part no. MS3181-12N, and the terminal 118b for the each of the first interface 120 and the second interface 116 may be terminal, e.g., part no. MS3124E12-10S. In some examples, the cap may be tethered to the terminal, and may include a mounting ring. In other embodiments, each of the input 122, the first interface 120, and the second interface 116 includes only the terminal 118b. The terminals 118b may have one or more pins to receive and to send various signals and/or voltages and currents. The cap 118a is removably connected to the terminal 118b, and is configured to protect the one or more pins of the terminal 118b from being damaged by sources, such as dust, water, or impacts from objects, in an environment outside the chassis 102. The terminal 118b may be a female terminal, for example. In some embodiments, the terminal 118b of each of the input 122, the first interface 120, and the second interface 116 is configured to interface with a cable to either supply or receive power, based on whether the cable is interfaced with the input 122, the first interface 120, or the second interface 116. For example, the terminal of the input 122 is configured to interface with a cable to receive voltage and current from an outside power source. In another example, the terminal of the second interface is configured to interface with a cable to supply voltage and current to a targeting system 222. In one or more embodiments, the system 100 weighs 15-20 pounds. In one or more embodiments, the system 100 is configured to interface with a M220 TOW 2 weapon system or the like, for example. In other embodiments, the system 100 is configured to interface with other weapon systems that may utilize the same, similar, and/or substantially the same power systems as disclosed herein.

In one or more embodiments, the input 122 is a connector configured to receive power from either an alternating current (AC) power source, such as an AC power outlet, and/or direct current (DC) power source, such as an automobile alternator or battery. In some embodiments, the AC power, being received from the AC power source, is converted to DC power before entering the system 100. For example, the AC power source may be connected to the input 122 via an AC to DC adapter, in which the AC to DC adapter converts the power from AC power to DC power before entering the system 100. The AC to DC adapter may be, for example, a commercial off the shelf (COTS) AC/DC adapter. The COTS AC/DC adapter is configured to convert 90 V to 264 V of AC power at 43 Hz minimum to 400 Hz maximum to 24V of conditioned DC power before entering the chassis 102.

In one or more embodiments, the first interface 120 is a connector configured to provide power to the guidance system 224. The first interface 120 may be configured with three outputs each being configured to provide power having different voltages to the guidance system 224. A first output may provide power at or about 24 volts (V). For example, the first output may provide power at 24V having a fluctuation between 22 V to 26.5 V with maximum loads. A second output may provide power at or about plus 50V. For example, the second output may provide power at plus 50V, and may fluctuate between 46.5 V to 53.5 V with maximum loads. A third output may provide power at or about minus 50V. For example, the third output may provide power at minus 50V, and may fluctuate between minus 53.5 V to minus 46.5 V with maximum loads. In one or more embodiments, the three outputs of the first interface 120 are configured to provide power at their respective voltages simultaneously, for example. In other embodiments, the three outputs of the first interface 120 are configured to provide power at their respective voltages based on the operations of the guidance system 224.

In one or more embodiments, the second interface 116 is a connector configured to provide power to a targeting system. At least one non-limiting embodiment of a targeting system may be a night sight system, for example. The second interface 116 may be configured with two outputs each being configured to provide power having different voltages to the targeting system. A first output may provide power at or about 16.8V. For example, the first output may provide power at 16.8V, and may fluctuate between 17.1V and 16.1V with maximum loads. A second output may provide power at or about 4.8V. For example, the second output may provide power at 4.8V having a +/−0.3V line regulation with maximum loads. In one or more embodiments, the two outputs of the second interface 116 are configured to provide power at their respective voltages simultaneously. In other embodiments, the two outputs of the second interface 116 are configured to provide power at their respective voltages based on the operations of the targeting system.

In some embodiments, the system 100 includes a switch 108. The switch 108 may be an ON/OFF switch, for example, a toggle switch. When the switch 108 is turned ON, the switch 108 may be configured to have both the first interface 120 and the second interface 116 provide power at their respective output voltages to the MGS and the targeting system, respectively. When the switch 108 is turned OFF, the switch 108 may be configured to have both the first interface 120 and the second interface 116 stop providing power to the MGS and the targeting system respectively. In some embodiments, when the input 122 is connected to either an AC or DC outside power source, the system 100 automatically begins to charge the battery packs 124a and 124b of the system 100. The battery packs 124a and 124b may be rechargeable lithium ion batteries or non-rechargeable batteries in a similar form factor, for example. The batteries may be surrounded by a heating element to enable charging and discharging operation at extremely low temperatures. The battery packs 124a and 124b may also be, in a non-limiting example, BB-2590, BB-3590, or other standard type batteries each having two 14.4V nominal sections configured in parallel, thereby two charging chips, such as charging chip 226a, 226b, 228a, and 228b, are provided for each battery pack 124a and 124b. The system 100 may be configured to charge battery packs 124a and 124b using either AC or DC outside power sources. In some embodiments, the system 100 charges the battery packs 124a and 124b with 100 W or about 100 W +/− a nominal amount of 25 W, for example. In other embodiments, the system 100 charges the battery packs 124a and 124b at power values based on the design of the system 100. In some embodiments, the system 100 is configured to charge the battery packs 124a and 124b at different rates. For example, the system 100 may be set in a trickle, maintenance, and/or float charge setting, in which the system 100 charges the battery packs 124a and 124b using a low current value and which stops the charging process when the state of charge for the battery packs 124a and 124b is at full capacity. In another example, the system 100 may be set in a normal charge setting, in which the system 100 charges the battery packs 124a and 124b using a typical current value for charging the battery packs. In yet another example, the system 100 may be set in a fast charge setting, in which the system 100 charges the battery packs 124a and 124b using a high current value. In some examples the charge settings of the system 100 may be set automatically by electronics depending on battery capacity needs.

In some embodiments, the system 100 includes a display 112 and a switch 114. The display 112 may be a state-of-charge display (SOC) to display the status of the system 100. It may also be configured to display the health of the system. For example, the display 112 may display the amount of energy capacity remaining in the one or more battery cells, for example the battery cell 124a and the battery cell 124b, of the system 100, or the display 112 may display the average of the 4 string capacity levels of the charge battery packs 124a and 124b. In another example, the display 122 may display a "no fault" status, which indicates that the system 100 is operating without errors. In other examples, the display 112 may display: (a) an indicator that charging of the battery packs 124a and 124b is enabled, (b) an indicator of the internal temperature of the system 100, and/or (c) one or more battery string voltages. In some embodiments, the switch 114 is configured to provide one or more functions of the system 100. For example, if the switch 114 receives a press type input from a user, the display 112 may display the status of the system 100. In another example, if the switch 114 receives a press and hold type input from a user, the display 112 may cycle through various brightness levels for a user to select. In yet another example, if the switch 114 receives a press and hold type input for a predetermined amount of time, such as 15 seconds, from a user, the system 100 may reset.

Figure 1B:
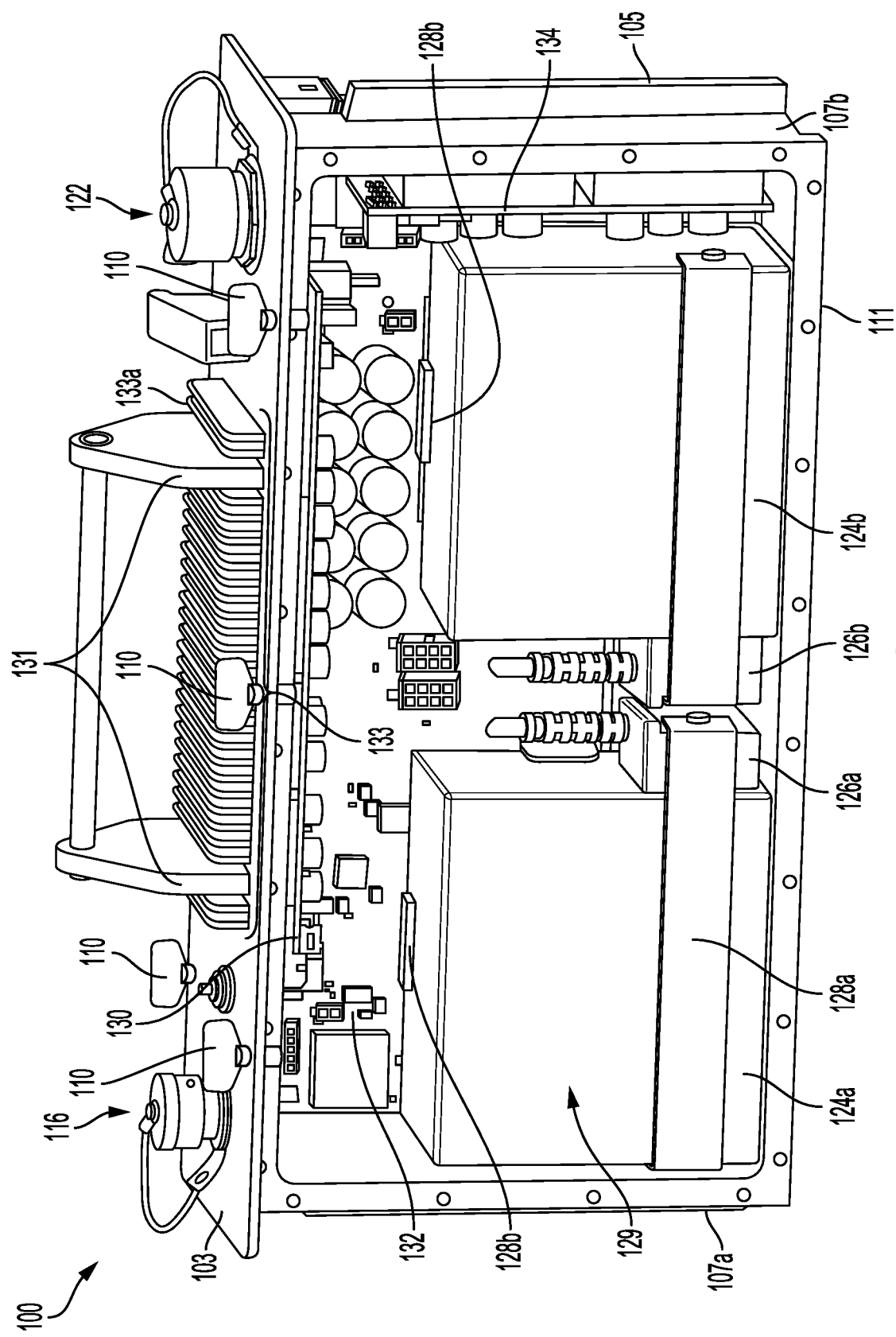
FIG. 1B illustrates a perspective view of an inner portion of the integrated power system of FIG. 1A.
Figure 1C:
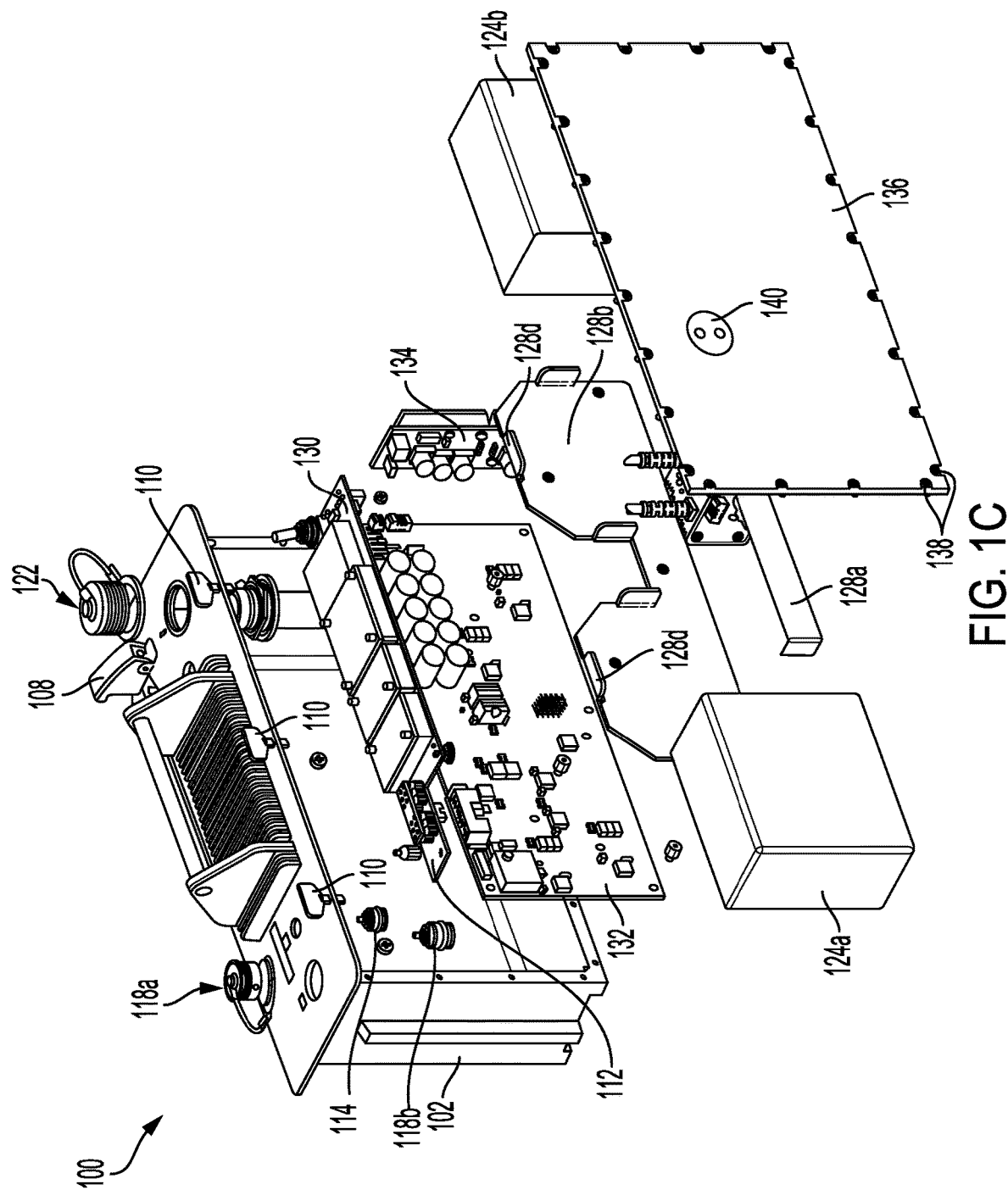
FIG. 1C illustrates a perspective view of the integrated power system of FIG. 1A in an unassembled configuration.

FIG. 1B illustrates a perspective view of an inner portion 129 of the system 100 of FIG. 1A, according to one or more embodiments of the present disclosure. FIG. 1C illustrates a perspective view of the system 100 of FIG. 1A in an unassembled configuration, according to one or more embodiments of the present disclosure.

In some embodiments, the system 100 includes a heatsink 106 on the upper wall 103 of the chassis 102. The heatsink 106 is configured to thermally conduct and convect heat out of the chassis 102, in which the heat may be generated by one or more components within the inner portion 129 of the chassis 102. The heatsink 106 may be positioned near the center of the upper wall 103, for example. In one or more embodiments, the heatsink 106 includes multiple heatsink protrusions 133. In other embodiments, the heatsink 106 includes the multiple heatsink protrusions 133 and handle risers 131. In some embodiments, the multiple heatsink protrusions 133 and the handle risers 131 are casted with the chassis 102, such that the multiple heatsink protrusions 133 and the handle risers 131 are integrally formed with the chassis 102. The handle rises 131 may be connected by a crossbar, in which the handle risers 131 and the cross bar form the handle 104. In some embodiments, the heatsink 106 has an overall size at or about 6.75 inches wide by 3 inches long. In one or more embodiments, when the chassis 102 is inserted into a chassis receptacle of the guidance system 224. The chassis receptacle may cover each wall of the chassis 102, except for the upper wall 103 that is exposed to an outside environment. For example, the upper wall 103 is exposed to the atmosphere and/or moving air. In some embodiments, heat generated by various components of the inner portion 129 travels through the heatsink 106 and out to the outside environment.

Each of the multiple heatsink protrusions 133 may extend away from the upper wall 103, for example. A heatsink fin, such as heatsink 133a, may be sized at or about 3 inches long by 0.5 inches high by 0.09 inches thick. The multiple heatsink protrusions 133 may be spaced at or about 0.22 inches on center. In some embodiments, the heatsink 106 includes about 20-35 heatsinks, and more particularly about 27 heatsinks 133a. In a non limiting embodiment having 27 heatsinks, a set of two heatsinks 133a may be positioned outside of each of the handle risers 131, and the remaining 23 heatsinks 133a may be positioned in between both of the handle risers 131. In one or more embodiments, the heatsink 106 is configured to displace an amount of heat up to and/or approximately 45 W, based on whether the targeting system and/or guidance system 224 is discharging the system 100 or the input 122 is conditioning and converting power to 24V to charge the battery packs 124a and 124b and/or supply power to first interface 120 and/or the second interface.

In one or more embodiments, an access cover 136 forms a removably connected wall of the chassis 102. The access cover 136 may be fastened to the chassis 102 with fasteners 138, such as screws. In some embodiments, the fasteners 138 are captive fasteners, such that the fasteners 138 remain with the access cover 136 when the fasteners 138 are unfastened from the chassis 102. A user may remove the access cover 136 to access the inner portion 129 of the chassis 102. In one or more embodiments, the inner portion 129 of the chassis 102 includes one or more boards, such as a first board 130, a second board 132, a third board 134, and one or more battery packs, such as battery pack 124a, and battery pack 124b. The first board 130 may be located on the upper wall 103. The second board 132 may be located on the rear wall 105. The third board 134 may be located on either side wall 107a or side wall 107b. It should be noted that for purposes of discussion, the embodiments discussed herein are discussed in terms of the third board 134 being located on the side wall 107b; however, these features are equally applicable for the cases in which the third board 134 is located on the side wall 107a. The boards may each be fastened to its respective wall via fasteners, such as fasteners from mounting into printed circuit boards. Additionally, in some embodiments, (not illustrated) the first board 130, second board 132, third board 134 are configured as a single "mainboard," for example.

The battery pack 124a and battery pack 124b may be positioned in front of the second board 132 and the third board 134, and on the lower wall 111 of the chassis 102. A support bracket 128b may be positioned offset on a portion of the second board 132. The support bracket 128b may be fastened to the rear wall 105 via fasteners that extend through the support bracket 128b and the second board 132 and that fasten into the rear wall 105. The support bracket 128b may have one or more battery packs receiving portions 128b configured to separate the battery pack, such as battery pack 124b, from the second board 132. The battery pack receiving portion 128b may include one or more battery pack positioning tabs 128d configured to position the respective battery pack within the chassis 102. The battery pack positioning tabs 128d may be located in at least one of a top edge, a right side edge, and a left side edge of the battery pack receiving portion 128b. The battery pack positioning tabs 128d may be configured to prevent the one or more battery packs from moving within the chassis 102, thereby protecting the first board 130, the second board 132, and/or the third board 134 from being damaged by the one or more battery packs. In one or more embodiments, the battery pack 124a and the battery pack 124b are electrically coupled to the second board 132. The battery connector 126a may connect the second board 132 to the battery pack 124a, and the battery connector 126b connect the second board 132 to the battery pack 124b. A battery strap 128a may surround one or more sides of battery pack 124a and/or one or more sides of battery pack 124b. The battery strap 128a may be configured to prevent the battery connector 126a from disengaging from battery pack 124a and 124b. The battery strap 128a may be positioned between the access cover 136 and the battery pack 124a and 124b preventing the battery strap from detaching from the battery packs. The battery strap 128a may be configured to fasten to each battery connector 126a and 126b that are connected to the battery cell 124a and 124b, respectively, thereby connecting the battery cell 124a and battery cell 124a to the battery strap 128a.

In one or more embodiments, the first board 130 and the second board 132 are electrically coupled to one another, and the second board 132 and the third board 134 are electrically coupled to one another. In one or more embodiments, at least two of the first board 130, the second board 132, and the third board 134 include press-fit connectors, in which one press-fit connector of one board is configured to connect with a press-fit connector of the other board. For example, the first board 130 may include one press-fit connector and the second board 132 may include another press-fit connector configured to receive the press-fit connector of the first board 130. In another example, the first board 130 may include more than one press-fit connector, such as two connectors, configured to mate with the corresponding press-fit connectors, such as another two connectors, on the second board 132. The press-fit connectors of the first board 130 and the second board 132 are configured to be mated together at a right angle. The press-fit connectors may facilitate the transmission of data and electrical signals, such as currents and voltages, from one board to another and vice versa. In one or more other embodiments, at least two of the first board 130, the second board 132, and the third board 134 include other connector systems configured to exchange data and/or electrical signals between at least two boards. For example, the second board 132 and the third board 134 may each have a terminal configured to mate with an end of a wiring harness, in which data and/or electrical signals are exchanged between the second board 132 and the third board 134 via the wires included with the wiring harness.

Figure 2:
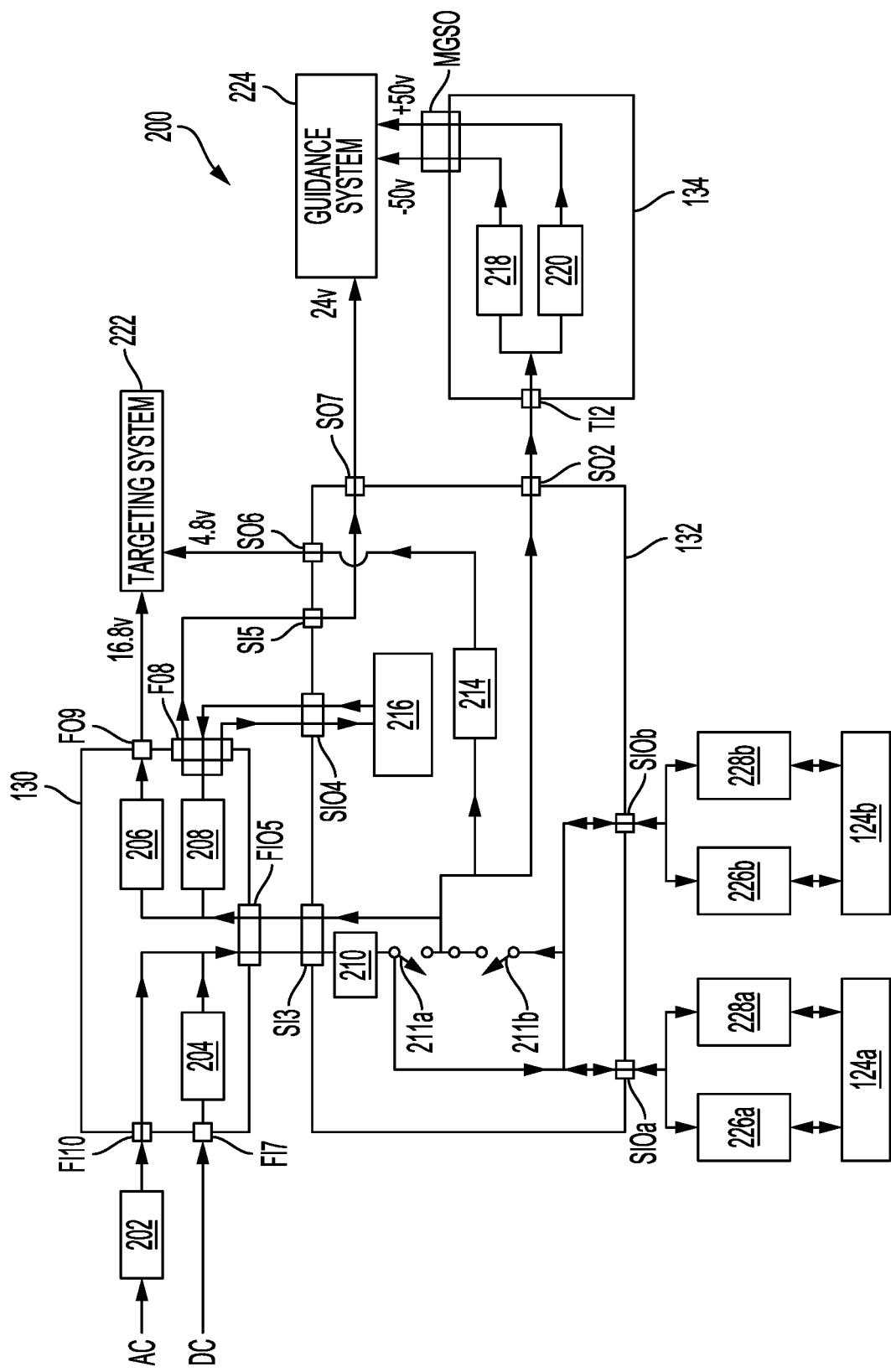
FIG. 2 illustrates an interconnect diagram of the integrated power system of FIG. 1A.

FIG. 2 illustrates an interconnect diagram 200 of the system 100 of FIG. 1A, according to one or more embodiments of the present disclosure.

In one or more embodiments, the first board 130, the second board 132, and the third board 134 include heat producing electrical components. The heat producing electrical components may include at least a 24V DC/24V DC power converter 204, a passive electromagnetic interference or conditioning filter component, a 24V DC/16.8V DC power converter 206, a 24V DC/24V DC power converter 208, a 24V DC/4.8V DC power converter 214, a 24V DC/50V DC power converter 218, a 24V DC/50V DC power converter 220, at least one charging chip, such as charging chip 226a and charging chip 228a, for the battery pack 124a, and at least one charging chip, such as charging chip 226b and charging chip 228b, for the battery pack 124b. In some embodiments, the heat producing components are positioned on the first board 130, the second board 132, and the third board 134 within the chassis 102 to dissipate heat, generated by the heat producing components, through the heatsink 106 or into a wall of the chassis 102.

In one or more embodiments, the first board 130 includes a 24V DC/24V DC power converter 204, a passive electromagnetic interference or conditioning filter component, a 24V DC/16.8V DC power converter 206, and a 24V DC/24V DC power converter 208. In some embodiments, the 24V DC/24V DC power converter 204, a passive electromagnetic interference or conditioning filter component, the 24V DC/16.8V DC power converter 206, and the 24V DC/24V DC power converter 208 may be positioned on the rear surface of the first board 130 facing the heatsink 106. The first board 130 may be configured to be removed and connected to the system 100, for example. By being able to be removed and connected to the system 100, the first board 130 may be easily replaced if or when one or more electronic components on the first board 130 becomes defective. In other embodiments, the first board 130 may include several removably connected boards, in which the one or more removably connected boards may include various electronic components of the first board 130 and at least one of the 24V DC/24V DC power converter 204, a passive electromagnetic interference or conditioning filter component, the 24V DC/16.8V DC power converter 206, and the 24V DC/24V DC power converter 208. For example, the first board 130 may include two removably connected boards, in which one removably connected board includes the 24V DC/24V DC power converter 204 and the 24V DC/16.8V DC power converter 206, and in which the other removably connected board includes the 24V DC/24V DC power converter 208. The removably connected boards may be electrically coupled to one another (and/or mechanically coupled to one another), thereby forming the first board 130. The removably connected boards may be configured to be removed and connected to the system 100. By being able to be removed and connected to the system 100, a power converter may be easily replaced when the power converter becomes defective.

In some embodiments, the 24V DC/24V DC power converter 204, a passive electromagnetic interference or conditioning filter component, the 24V DC/16.8V DC power converter 206, and the 24V DC/24V DC power converter 208 are configured to be thermally interfaced with the heatsink 106. For example, a baseplate of the DC power converter transfers heat out of the DC power converter through the conductive baseplate and into a portion of the chassis 102, such as the heatsink 106, via a thermal paste or thermal pad. The thermal paste or pad may have at least 5 W/mK thermal conductivity. That is, the heat generated by the 24V DC/24V DC power converter 204, a passive electromagnetic interference or conditioning filter component, the 24V DC/16.8V DC power converter 206, and the 24V DC/24V DC power converter 208 is directed towards the heatsink 106. In some embodiments, the 24V DC/24V DC power converter 204, a passive electromagnetic interference or conditioning filter component, the 24V DC/16.8V DC power converter 206, and the 24V DC/24V DC power converter 208 are heat producing electrical components that have the highest heat producing potential. For example, the 24V DC/24V DC power converter 204, a passive electromagnetic interference or conditioning filter component, the 24V DC/16.8V DC power converter 206, and the 24V DC/24V DC power converter 208 may produce heat resulting in the highest temperature among the components in the system 100. Additionally, by having the highest heat producing potential, at a full load the 24V DC/24V DC power converter 204, a passive electromagnetic interference or conditioning filter component, the 24V DC/16.8V DC power converter 206, and the 24V DC/24V DC power converter 208 may produce the greatest amount of heat to be dissipated into the outside environment, for example. In some examples, the 24V DC/24V DC power converter 204, a passive electromagnetic interference or conditioning filter component, the 24V DC/16.8V DC power converter 206, and the 24V DC/24V DC power converter 208 produce at or about 75% of the total heat generated within the system 100.

In one or more embodiments, the second board 132 includes charging chips 226a, 226b, 228a, and 228b, and 24V DC/4.8V DC power converter 214. In some embodiments, the charging chips 226a, 226b, 228a, and 228b are positioned on the rear surface of the second board 132 facing the rear wall 105. The second board 132 may be configured to be removed and connected to the system 100. By being able to be removed and connected to the system 100, the second board 132 may be easily replaced when one or more electronic components on the second board 132 becomes defective, for example. In other embodiments, the second board 132 may include several removably connected boards, in which the one or more removably connected boards may include various electronic components of the second board 132 and at least one of the charging chips 226a, 226b, 228a, and 228b, and 24V DC/4.8V DC power converter 214. For example, the second board 132 may include three removably connected boards, in which one removably connected board includes the charging chips 226a and 228a, another removably connected board includes the charging chips 226b and 228b, and a third removably connected board includes the 24V DC/4.8V DC power converter 214. The removably connected boards may be electrically coupled to one another (and/or mechanically coupled to one another), thereby forming the second board 132. The removably connected boards may be configured to be removed and connected to the system 100. By being able to be removed and connected to the system 100, a power converter may be easily replaced when the power converter becomes defective.

In one or more embodiments, the charging chips 226a, 226b, 228a, and 228b may be configured to thermally interface with the rear wall 105, such that heat generated by one or more of the charging chips 226a, 226b, 228a, and 228b is thermally conducted into the chassis 102, in particular a portion the rear wall 105 or all of the rear wall 105. In some examples, each charging chip 226a, 226b, 228a, and 228b may each produce up to 2.5 W of heat, thereby producing up to 10 W of output heat. In some embodiments, the 24V DC/4.8V DC power converter 214 is positioned on the front surface of the second board 132 facing the access cover 136. In some embodiments, the 24V DC/4.8V DC power converter 214 is configured to thermally interface with the volume of the chassis 102, that is, the space of the inner portion 129. In some examples, the 24V DC/4.8V DC power converter 214 may produce up to or about 1 W of heat. The 24V DC/4.8V DC power converter 214 is a heat producing electrical component that has the lowest heat producing potential.

In one or more embodiments, the third board 134 includes the 24V DC/50V DC power converter 218 and the 24V DC/50V DC power converter 220. In some examples, the 24V DC/50V DC power converter 218 and the 24V DC/50V DC power converter 220 may each produce an average of 3 W of heat. In some embodiments, the 24V DC/50V DC power converter 218 and the 24V DC/50V DC power converter 220 are positioned on a rear surface of the third board 134 facing either sidewall 107b. The third board 134 may be configured to be removed and connected to the system 100. By being able to be removed and connected to the system 100, the third board 134 may be easily replaced when one or more electronic components on the third board 134 if it becomes defective. In other embodiments, the third board 134 may include several removably connected boards, in which the one or more removably connected boards may include various electronic components of the third board 134 and at least one of the 24V DC/50V DC power converter 218 and the 24V DC/50V DC power converter 220. For example, the third board 134 may include two removably connected boards, in which one removably connected board includes the 24V DC/50V DC power converter 218, and in which the other removably connected board includes the 24V DC/50V DC power converter 220. The removably connected boards may be electrically coupled to one another (and/or mechanically coupled to one another), thereby forming the first board 130. The removably connected boards may be configured to be removed and connected to the system 100. By being able to be removed and connected to the system 100, a power converter may be easily replaced when and/or if the power converter becomes defective, for example.

The 24V DC/50V DC power converter 218 and the 24V DC/50V DC power converter 220 may be configured to thermally interface with the sidewall 107b, such that heated generated by at least one of the 24V DC/50V DC power converter 218 and the 24V DC/50V DC power converter 220 is thermally conducted into the chassis 102, in particular the sidewall 107b. In some examples, the heat potential generated by the 24V DC/50V DC power converter 218 and the 24V DC/50V DC power converter 220 is less than the heat potential generated by the charging chips 226a, 226b, 228a, and 228b.

In one or more embodiments, the first board 130 is configured to receive DC power from an external power source. For the cases in which AC power is used as an input power source, an AC/DC adapter 202 externally converts the AC power to DC power before entering the chassis 102 at input FI10. The AC/DC adapter 202 may be, for example, a COTS AC/DC adapter. In some embodiments, the AC/DC adapter 202 is configured to convert the AC power into a converted 24V of DC power. For the cases in which DC power is used as an input power source, the first board 130 is configured to receive 12V-36V of DC power at input FI7. The 24V DC/24V DC power converter 204 of the first board 130 is configured to internally convert, at the first board 130, the 12V-36V of DC power to a converted 24V of DC power. In one or more embodiments, input 122 includes both FI10 and input FI7. For example, the terminal D38999/24WD97PN of input 122 may include 12 contacts, in which 8 contacts are 20 gauge and 4 contacts are 16 gauge. The 4 contacts at 16 gauge may be used for DC input power, and 4 contact at 20 gauge are used for input power from an AC/DC adapter. In one or more embodiments, the converted AC and DC power is provided to a 24V power bus configured to distribute and receive power from the second board 132 and the third board 134. In one or more embodiments, the converted AC and DC power can be used to charge the battery packs 124a and 124b, can provide power to the targeting system 222, and/or can provide power to the guidance system 224, e.g., a MGS.

In one or more embodiments, the second board 132 is configured to receive at input SI3 a converted 24V of DC power from the first board 130 at output FIO5. In some embodiments, the second board 132 is configured to use the converted 24V of DC power to charge at least one of the battery strings within battery pack 124a or 124b and to supply power to operate the targeting system 222 and the guidance system 224.

In some embodiments, the converted AC and DC power can be used to operate the targeting system 222 and the guidance system 224 without using power from the battery packs 124a and 124b. To operate the targeting system 222 and the guidance system 224 without using power from the battery packs 124a and 124b, a switch 211a is closed, thereby routing power to the targeting system 222 and the guidance system 224. In one or more embodiments, when the switch 108 is turned ON, switch 211a is closed.

Figure 3:
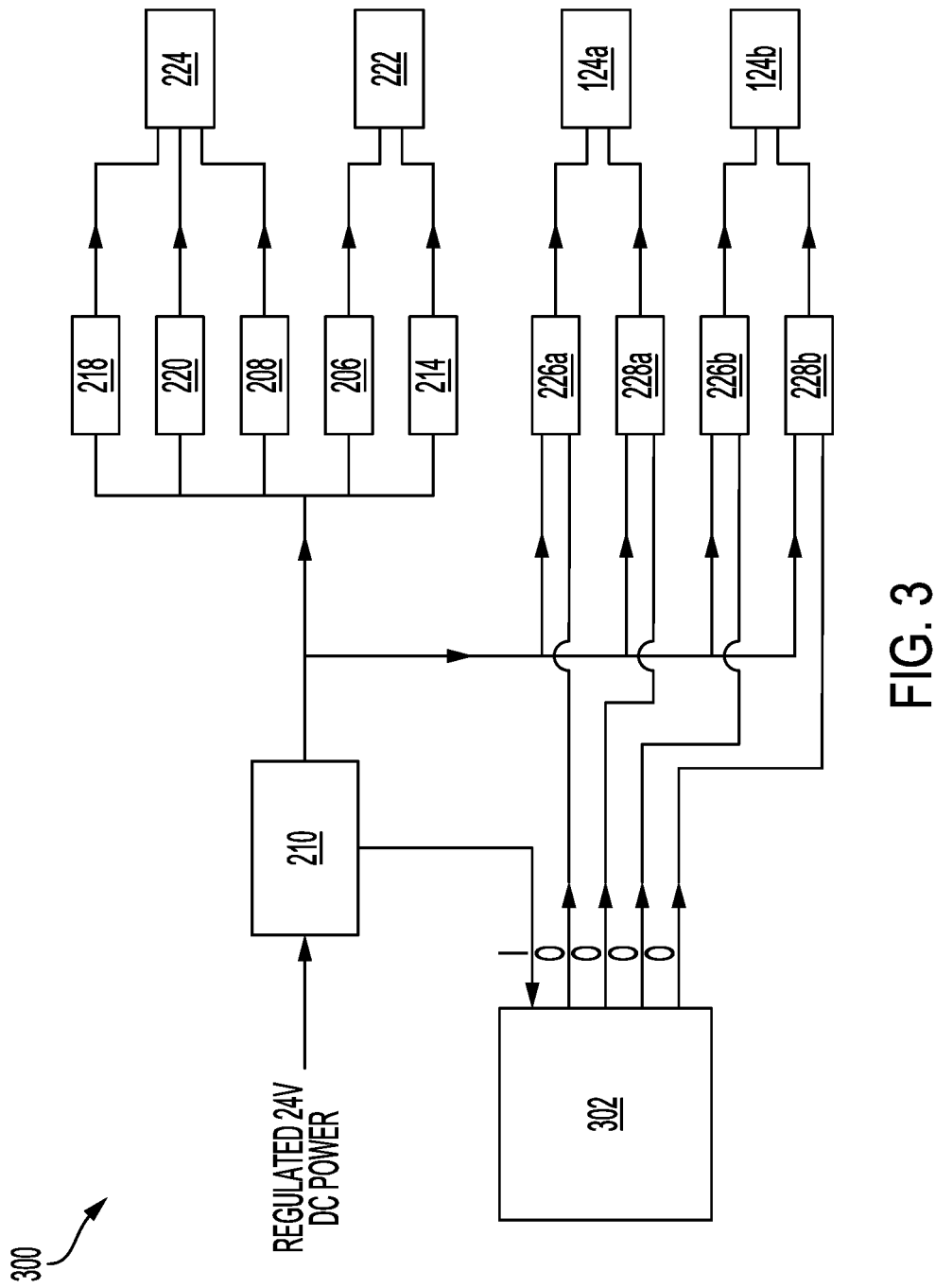
FIG. 3 illustrates a schematic of a current sensor of the interconnect diagram of FIG. 2.

For the cases in which switch 211a is closed, the second board 132 receives at input SI3 the converted 24V DC power from output FIO5. The converted 24V DC power passes to a current sensor 210 provided on the second board 132. In one or more embodiments, current sensor 210 is provided to, for the cases in which the first board 130 receives input power at either FI10 or FI7, prevent the system 100 from charging the battery packs 124a and 124b at the same time as providing power to the targeting system 222 and the guidance system 224. FIG. 3 illustrates a schematic 300 of the current sensor 210 of the interconnect diagram 200 of FIG. 2, according to one or more embodiments of the present disclosure. When a missile is being fired, there may be cases in which the system 100 cannot provide power from an outside power source to both the targeting system 222 and the guidance system 224 and the battery cells 124a and 124b simultaneously. In some embodiments, the current sensor 210 is configured to sense the amount of power being output from the system 100. If the amount of power being output from the system 100 exceeds a threshold, then the current sensor 210 sends a signal I to a microcontroller 302 to disable charging the battery cells 124a and 124b for a duration of time corresponding to the length of time necessary to fire a missile. The microcontroller 302 sends a signal O to the charging chips 126a, 126b, 128a, and 128b to disable charging. In some embodiments, after a missile has been fired, the system 100 is configured to automatically start recharging the battery packs 124a and 124b. The microcontroller 302 may send a signal to the charging chips 126a, 126b, 128a, and 128b to enable charging. In some embodiments, the system 100 is configured to disable charging the battery cells 124a and 124b based on the duration of time from when a missile is fired until impact of the missile on a target.

In one or more embodiments, to provide the required power to the targeting system 222, the first board is configured to provide 16.8V of DC power to the targeting system 222, and the second board is configured to provide 4.8V of DC power to the targeting system 222. From the current sensor 210, the converted 24V DC power passes to the 24V DC/16.8V DC power converter 206, the 24V DC/24V DC power converter 208, and the 24V DC/4.8V DC power converter 214. In some embodiments, the 24V DC/16.8V DC power converter 206 is configured to convert the converted 24V DC power, provided from the 24V DC/24V DC power converter 204 or the AC/DC adapter 202, to 16.8V of DC power. Thereafter, having converted the 24V converted DC power, the first board 130 provides 16.8V DC to the targeting system 222. In some embodiments, the 24V DC/4.8V DC power converter 214 is configured to convert the converted 24V DC power, provided from the 24V DC/24V DC power converter 204 or the AC/DC adapter 202, to 4.8V of DC power. Thereafter, having converted the 24V converted DC power, the second board 132 provides 4.8 VDC to the targeting system 222.

In one or more embodiments, to provide the required power to the guidance system 224, the first board 130 is configured to provide, in conjunction with the capacitor circuit 216 provided on the second board 132, 24V of DC power to the guidance system 224; and the second board 132 is configured to provide the converted 24V of DC power to the 24V DC/50V DC power converter 218 and the 24V DC/50V DC power converter 220 provided on the third board 134, in which the third board 134 is configured to provide plus 50V and minus 50V of DC power to the guidance system 224.

From the current sensor 210, the converted 24V DC power passes from the second board 132 to the 24V DC/50V DC power converter 218 and the 24V DC/50V DC power converter 220 provided on the third board 134. In some embodiments, the 24V DC/50V DC power converter 218 is configured to convert the converted 24V DC power, provided from the 24V DC/24V DC power converter 204 or the AC/DC adapter 202, to 50V of DC power. Thereafter, having converted the 24V converted DC power, the third board 134 provides 50 VDC to the guidance system 224. In some embodiments, the 24V DC/50V DC power converter 220 is configured to convert the converted 24V DC power, provided from the 24V DC/24V DC power converter 204 or the AC/DC adapter 202, to 50V of DC power. Thereafter, having converted the 24V converted DC power, the third board 134 provides 50 VDC to the guidance system 224.

From the current sensor 210, the converted 24V DC power passes from the second board 132 to the 24V DC/24V DC power converter 208 provided on the first board 130. In one or more embodiments, the 24V DC/24V DC power converter 208 can be a switching regulator and/or a 24V DC/24V DC power converter. The 24V DC/24V DC power converter 208 may require, for example, 20-40 seconds of output time having a running current at 4.5 amps (A) +/−5% and three 15+/−1 millisecond duration pulses. That is, the 24V DC/24V DC power converter 208 may operate for about 20-40 seconds while a missile is being fired. During the first pulse, there is, for example, a 28.2 A current spike. At or about 1.5 seconds after the first pulse, a second current spike, for example, occurs at 28.2 A. A third spike, for example, occurs at 28.2 A 18.5-38.5 seconds after the second current spike. It should be noted that that 24V DC/24V power converted 208 may run current at different amperages and different durations of maximum duration pulses to accommodate duration output times that are shorter and/or longer in duration than 20-40 seconds. For the cases in which, the 24V DC/24V DC power converter 208 cannot accommodate the short duration, high current transient spikes required by a guidance system 224 during a missile fire sequence, the capacitor circuit 216 may be configured to store the power required by the guidance system 224 and rapidly discharge and restore the power for follow-on sequences. In some embodiments, to increase the current of the power provided by the 24V DC/24V DC power converter 208, the 24V DC/24V DC power converter 208 is configured to initially provide the generated power to the capacitor circuit 216 in order to increase the high current at 24V as required by the guidance system 224. The high current may be, for example, 28.2 A spikes at 15+/−1 milliseconds, in which the spikes are no less than 1.5 seconds apart.

Figure 4:
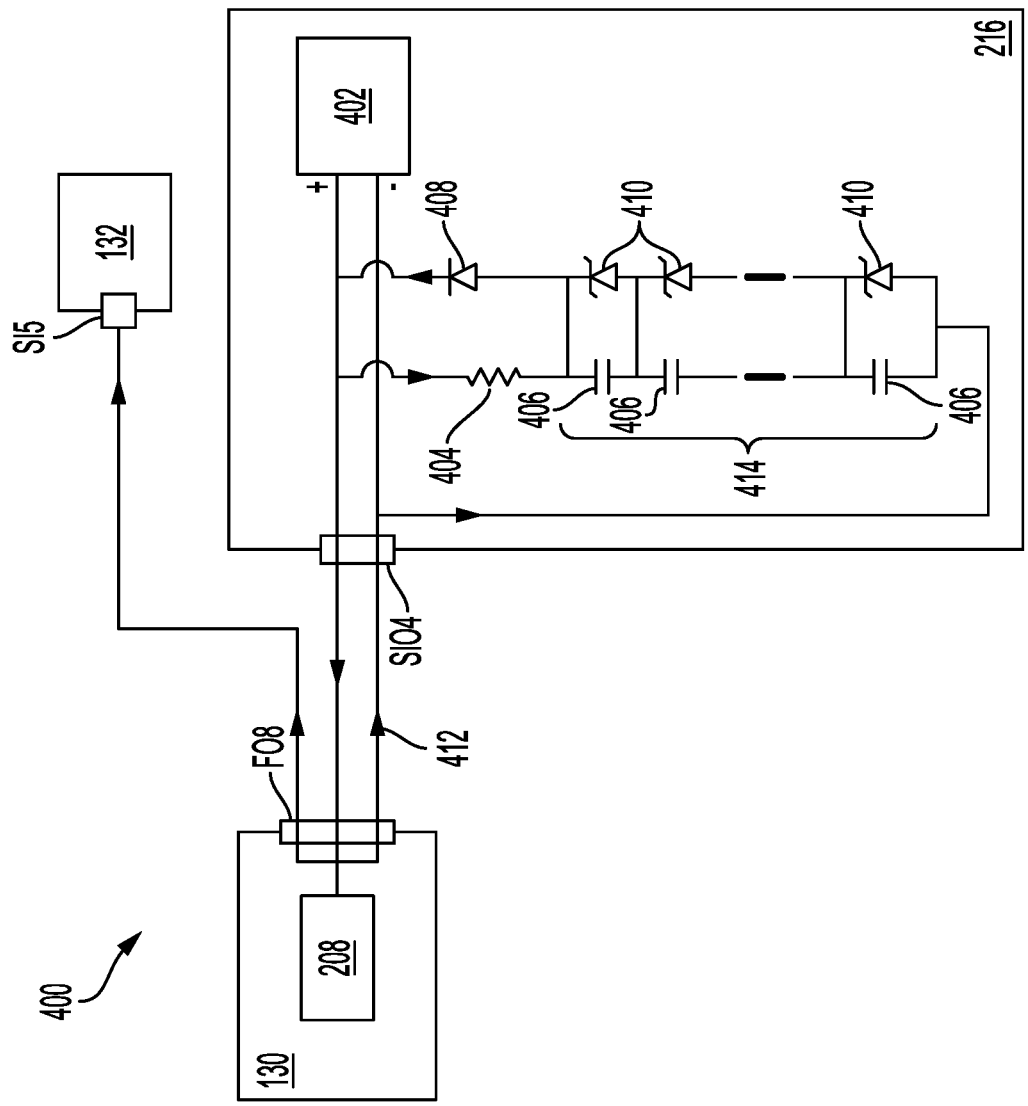
FIG. 4 illustrates a schematic of a voltage converter and a capacitor circuit of the interconnect diagram of FIG. 2.

FIG. 4 illustrates a schematic 400 of the 24V DC/24V DC power converter 208 and the capacitor circuit 216 of the interconnect diagram 200 of FIG. 2, according to one or more embodiments of the present disclosure. In one or more embodiments, the initial output 412 of the 24V DC/24V DC power converter is provided to the capacitor circuit 216. The capacitor circuit 216 may include a current limiting resistor 404, capacitors 406, Zener diodes 410, and a power diode 408. In some embodiments, the current limiting resistor 404 is configured to prevent the 24V DC/24V DC power converter 208 from overloading during charging of the capacitor bank 414. In one or more embodiments, the capacitors 406 each have an upper voltage limit of 2.7 to 3 volts and an electrical capacitance sufficient to provide the required transient currents. In some examples, ten 30 Farad capacitors 406 may be configured in series to one another. In one or more embodiments, the Zener diodes 410 are configured to protect against overvoltage in cases where the capacitance of the capacitors 406 are different.

At the capacitor circuit 216, the initial output 412 passes to a current limiting resistor 404. As the capacitors 406 charge, the current passing through the current limiting resistor 404 reduces to at or about zero current. When the current is reduced to at or near zero, the capacitor bank 414 is charged. For the cases in which the capacitor bank 414 is charging, the current flows from the 24V DC/24V DC power converter 208 to the capacitor circuit 216.

In cases in which the capacitance of the capacitors 406 in the capacitor bank are the same, each capacitor 406 charges to at or about 2.4V DC, thereby outputting 24V DC back to the 24V DC/24V DC power converter 208. Thereafter, the 24V DC/24V DC power converter 208 passes the power having a converted 24V DC power to the guidance system 224. In some embodiments, the second board 132 includes an area to route heavier gauge wiring through the second board 132 at input SI5 and output SO7 to the guidance system 224. The heavier gauge wiring may be used to supply the converted 24V DC power from the 24V DC/24V DC power converter 208 to the guidance system 224.

In cases in which the capacitance of a capacitor 406 is smaller than the capacitance of other capacitors 406 in the capacitor bank 414, the voltage may increase more quickly than the other capacitors 406, thereby creating risk of damaging the capacitor 406 if the voltage exceeds the upper limit of 2.7V DC. When the voltage of the capacitor 406 nears the upper limit, current flows through the parallel Zener diode 410, thereby limiting the capacitor 406 to 2.7V DC while still allowing current to flow to the remaining capacitors 406 in the capacitor bank 414.

In some embodiments, a high transient load 402 is configured to draw power. In one or more embodiments, when the high transient load 402 draws power, the 24V DC/24V DC power converter 208 decreases the output voltage, and the power diode 408 begins to conduct based on the capacitor voltage of the capacitor bank 414 being higher than the output voltage. In some embodiments, power diode 408 is configured to maintain the output voltage of the capacitor bank 414 flowing through the power diode 408 at or about 24V DC. Thus, in some embodiments, the current of the capacitor bank 414 does not flow until the output voltage drops to at or about 23.5V DC.

In some embodiments, when the output voltage decreases to 23.5V DC, the capacitor bank 414 is configured to discharge, based on transient duration to a lower voltage. For the cases in which the capacitor bank 414 is discharged, that is, during the discharge transient, the current flows from the capacitor circuit 216 to the 24V DC/24V DC power converter 208 via the power diode 408. Thereafter, the capacitor bank 414 is configured to recharge when the transient duration is complete.

For the cases in which input power at either FI10 or FI7 is not available, switch 211b is closed, thereby routing power from battery cells 124a and 124b to the targeting system 222 and the guidance system 224. In one or more embodiments, a microcontroller can be used to open and close switches 211a and 211b. In some embodiments, when the switch 108 is turned ON, a signal is sent to the microcontroller instructing the microcontroller to close switch 211a and open switch 211b. In some embodiments, when the switch 108 is turned OFF, a signal is sent to the microcontroller instruction the microcontroller to open switch 211a and close switch 211b. In one or more embodiments, when switch 211b is closed, battery packs 124a and 124b are configured to provide the required power to the targeting system 222 and the guidance system 224. In one or more embodiments, the power flows from battery packs 124a and 124b to the 24V DC/4.8V DC power converter 214, 24V DC/16.8V DC power converter, and thereafter to the targeting system 222 in a similar manner as the AC or DC power supplied from an outside source after said power passes current sensor 210. In one or more embodiments, the power flows from battery packs 124a and 124b to the 24V DC/24V DC power converter 208, the capacitor circuit, and thereafter to the guidance system 224 and to the 24V DC/50V DC power converter 218 and the 24V DC/50V DC power converter 220, and thereafter to the guidance system 224 in a similar manner as the AC or DC power supplied from an outside source after said power passes current sensor 210.

The embodiments may include devices to improve power quality and mitigate electromagnetic interference. These embodiments may include electromagnetic shielding on electrical conduits such as connectors, cabling, and harnesses. In some embodiments, electromagnetic shielding may also be included on chassis 102. These embodiments may also include y-capacitors at electrical energy entry and exit points.

The various embodiments described above are provided by way of illustration only and should not be construed to limit the claims attached hereto. Those skilled in the art will readily recognize various modifications and changes that may be made without following the example embodiments and applications illustrated and described herein, and without departing from the true spirit and scope of the following claims.

What is claimed is:

1. A power system comprising:
   a chassis configured to house:
   one or more rectifiers and one or more converters; and
   one or more boards, wherein:
   each board of the one or more boards is electrically coupled to at least one rectifier of the one or more rectifiers and at least one converter of the one or more converters;
   the one or more boards are configured to receive power and to simultaneously output power at one or more voltages;
   the one or more boards are configured to receive power from at least one power source and to selectively output power comprising at least five voltages;
   the one or more rectifiers and the one or more converters are configured to transform and convert the received power into a respective output power; and
   the one or more rectifiers and the one or more converters are thermally interfaced with one or more portions of the chassis.

2. The power system of claim 1, wherein the one or more boards are further configured to receive the power from at least one of an alternating current power source and/or a direct current power source.

3. The power system of claim 1, wherein the one or more rectifiers include a transform rectifier configured to transform a voltage of input power received from an outside alternating current power source and output power to the one or more boards.

4. The power system of claim 3, wherein the transform rectifier is thermally interfaced with a wall portion of the chassis.

5. The power system of claim 3, wherein the chassis includes a heatsink and the transform rectifier is thermally interfaced with the heatsink of the chassis.

6. The power system of claim 5, wherein the heatsink is configured to thermally conduct and convect heat to an outside environment.

7. The power system of claim 3, wherein the one or more converters are thermally interfaced with a wall portion of the chassis.

8. The power system of claim 3, wherein the chassis includes a heatsink and at least one of the one or more converters are thermally interfaced with the heatsink of the chassis.

9. The power system of claim 8, wherein the heatsink is configured to thermally conduct and convect heat to an outside environment.

10. The power system of claim 1, wherein the power source is an internal power source that is rechargeable or is non-rechargeable.

11. The power system of claim 1, wherein the one or more boards are electrically coupled to one another and use a connector to sense the type of power source connected and determine an ability to be recharged.

12. The power system of claim 1, wherein:
    the one or more converters include a first converter, a second converter, a third converter, a fourth converter, a fifth converter, and a sixth converter,
    each of the first through sixth converters is configured to convert voltage of input power received from an outside direct current power source or convert voltage received from a transform rectifier configured to transform voltage received from an outside alternating current power source, and
    each of the first through sixth converters is configured to provide the respective output power on the basis of the outside direct current power source or the outside alternating current power source.

13. The power system of claim 12, wherein the second and third converters are configured to output power at a first voltage and a second voltage to a targeting system.

14. The power system of claim 12, wherein the fourth, fifth, and sixth converters are configured to output power at a third voltage, a fourth voltage, and a fifth voltage to a missile guidance system.

15. The power system of claim 12, wherein the fourth converter is electrically coupled to a capacitor bank circuit configured to increase current of the output power provided at the third voltage.

16. The power system of claim 1, wherein the one or more boards include one or more charging chips configured to charge one or more internal batteries and to supply output power to at least one of: a targeting system and/or a guidance system.

17. The power system of claim 16, wherein:
at least one charging chip of the one or more charging chips is positioned on a surface of at least one board of the one or more boards proximate a wall of the chassis;
the at least one charging chip of the one or more charging chips is thermally interfaced with the wall; and
a portion of the wall is configured to thermally conduct heat from the at least one charging chip.

18. The power system of claim 1, wherein the one or more boards include a current sensor circuit configured to prevent charging of an internal power source while the one or more boards are outputting one or more voltages.

19. The power system of claim 1, wherein at least one of: the chassis, at least one of the one or more boards, at least one of the one or more rectifiers, and/or at least one of the one or more converters contain shielding and/or capacitors to inhibit electromagnetic interference.

20. The power system of claim 1, wherein the power source is an internal power source that is non-rechargeable.

21. The power system of claim 1, wherein the power source is an internal power source disposed within the chassis.

22. The power system of claim 1, wherein the power source is an external power source disposed within the chassis.

23. A power system comprising:
a chassis configured to house:
one or more rectifiers and one or more converters; and
one or more boards, the one or more boards being electrically coupled to the one or more rectifiers and one or more converters, wherein:
the one or more boards are configured to receive power from one or more power sources and to simultaneously output power, respectively,
a cumulative total of the respective and simultaneously output power comprises a plurality of different voltages;
the one or more rectifiers and one or more converters are configured to transform and convert the received power into the respective output power; and
the one or more rectifiers and one or more converters are thermally interfaced with one or more heatsink portions of the chassis.

24. A power system comprising:
a chassis configured to house:
a first rectifier and a first converter configured to transform and convert received power from at least one power source; and
a first board electrically coupled to the first rectifier and the first converter,
wherein:
the first board is configured to output a first power output comprising one or more voltages, and
the first rectifier and the first converter are thermally interfaced with a portion of the chassis.

25. A power system according to claim 24, comprising:
a second rectifier and a second converter configured to transform and convert received power from at least one power source; and
a second board electrically coupled to the second rectifier and the second converter, wherein:
the second rectifier, the second converter, and the second board are housed within the chassis,
the second board is configured to output a second power output comprising one or more voltages,
the second rectifier and the second converter are thermally interfaced with a portion of the chassis,
the first board and the second board are configured to simultaneously output the first power output and the second power output, and
the first power output and the second power output cumulatively comprise at least five different voltages.

26. The power system of claim 25, wherein the first board is configured to output the first power output to a targeting system and the second board is configured to output the second power output to a guidance system.

27. The power system of claim 25, wherein
the at least five different voltages comprises a first voltage, a second voltage, a third voltage, a fourth voltage, and a fifth voltage,
the first voltage and the second voltage are provided to a targeting system, and
the third voltage, fourth voltage, and fifth voltage are provided to a guidance system.

28. A power system according to claim 24, comprising:
a second rectifier and a second converter configured to transform and convert received power from at least one power source;
a third rectifier and a third converter configured to transform and convert received power from the at least one power source;
a second board electrically coupled to the second rectifier and the second converter; and
a third board electrically coupled to the third rectifier and the third converter, wherein:
the second rectifier, the third rectifier, the second converter, the third converter, the second board, and the third board are housed within the chassis,
the second board is configured to output a second power output comprising one or more voltages,
the third board is configured to output a third power output comprising one or more voltages,
the second rectifier, third rectifier, second converter, and the third converter are thermally interfaced with a portion of the chassis,
the first board, second board, and the third board are configured to simultaneously output the first power output, second power output, and the third power output, and
the first power output, second power output, and the third power output cumulatively comprise at least five different voltages.

29. The power system of claim 28, wherein:
at least one of the first power output, second power output, and third power output are provided to a targeting system, and
at least one of the first power output, second power output, and third power output are provided to a guidance system.

30. The power system of claim 28, wherein
the at least five different voltages comprise a first voltage, a second voltage, a third voltage, a fourth voltage, and a fifth voltage,
the first voltage and the second voltage are provided to a targeting system, and
the third voltage, fourth voltage, and fifth voltage are provided to a guidance system.

\* \* \* \* \*